United States Patent
Ives et al.

(10) Patent No.: US 7,847,301 B2
(45) Date of Patent: Dec. 7, 2010

(54) ELECTRONIC MICROCIRCUIT HAVING INTERNAL LIGHT ENHANCEMENT

(75) Inventors: Fred H. Ives, Veradale, WA (US); Dean Nicholson, Windsor, CA (US); Jonathan Storie, Santa Rosa, CA (US); Brian Carlson, Spokane, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 1097 days.

(21) Appl. No.: 11/291,949

(22) Filed: Dec. 1, 2005

(65) Prior Publication Data

US 2006/0118807 A1 Jun. 8, 2006

Related U.S. Application Data

(63) Continuation-in-part of application No. 11/007,359, filed on Dec. 8, 2004.

(51) Int. Cl.
*H01L 29/267* (2006.01)
(52) U.S. Cl. .......................... 257/82; 257/100; 257/433; 257/724; 257/E25.032
(58) Field of Classification Search .................. None
See application file for complete search history.

(56) References Cited

U.S. PATENT DOCUMENTS

| | | | | |
|---|---|---|---|---|
| 3,622,419 A | * | 11/1971 | London et al. ................ | 438/64 |
| 3,818,451 A | * | 6/1974 | Coleman ...................... | 326/104 |
| 4,054,801 A | * | 10/1977 | Breval et al. .................. | 250/551 |
| 4,506,151 A | * | 3/1985 | MacDonald et al. ... | 250/214 LS |
| 4,942,076 A | | 7/1990 | Panicker et al. | |
| 5,089,881 A | | 2/1992 | Panicker et al. | |
| 5,327,104 A | * | 7/1994 | Kikushima .................... | 331/68 |
| 5,340,993 A | * | 8/1994 | Salina et al. ................... | 250/551 |
| 5,610,395 A | * | 3/1997 | Nishiyama ..................... | 250/239 |
| 5,808,322 A | * | 9/1998 | Nicholson et al. ............. | 257/80 |

(Continued)

FOREIGN PATENT DOCUMENTS

JP 53145587 A * 12/1978

(Continued)

OTHER PUBLICATIONS

U.S. Appl. No. 11/007,359, filed Dec. 8, 2005, Fred H. Ives et al.

*Primary Examiner*—Alonzo Chambliss

(57) ABSTRACT

By adding light reflective and/or transparent and/or translucent material within a micro-electronic circuit housing, improved light transfer is achieved between a light generation source and a light utilization device. In one embodiment, the reflective material is placed on the inside surface of a non-metallic housing lid and the light from the light source (typically an LED) reflects from the reflective material and impacts the device (typically an FET). In another embodiment, the LED and FET are encased in a clear (low light-loss) material (typically silicone overcoat) so as to allow the light from the LED to reflect from the top of the clear material onto the FET. If desired, an opaque encapsulant surrounds the clear material and fills out the volume within the housing. In another embodiment, clear or translucent (as opposed to opaque) encapsulant can be used to serve dual purpose as both the structural (volume filling, defined package share/outline) agent as well as to permit the internal light transmission and reflections to illuminate the device.

27 Claims, 4 Drawing Sheets

U.S. PATENT DOCUMENTS 5,825,054 A * 10/1998 Lee et al. .................. 257/98
6,051,848 A *  4/2000 Webb ........................ 257/99
6,876,271 B2   4/2005 Evers et al.
6,921,921 B2 *  7/2005 Sato ........................... 257/81

FOREIGN PATENT DOCUMENTS

JP        11233810 A  *  8/1999

* cited by examiner

ELECTRONIC MICROCIRCUIT HAVING INTERNAL LIGHT ENHANCEMENT

CROSS-REFERENCE TO RELATED APPLICATIONS

The present invention is a continuation-in-part of U.S. patent application Ser. No. 11/007,359, filed Dec. 8, 2004, entitled "LOW COST HERMETIC CERAMIC MICROCIRCUIT PACKAGE," to which priority is hereby claimed and which is hereby incorporated by reference herein. The present application is related to concurrently filed, and commonly assigned U.S. patent application Ser. No. 11/291,683, entitled "DUAL PATH ATTENUATION SYSTEM," the disclosure of which is hereby incorporated herein by reference.

TECHNICAL FIELD

This invention relates to non-metallic microcircuit packages and more particularly to systems and methods for making and using low cost microcircuit packages having internal light enhancement.

BACKGROUND

In many situations it is desirable to combine a light source, such as an LED, within the same package as an electronic circuit. For example, it has been found that Gallium Arsenide (GaAs) Field Effect Transistors (FETs) have better switching performance when they are subjected to high intensity light during the switching operation. This enhanced performance stems from a decrease in the "slow tail effect" when the FET is operated in the presence of light. U.S. Pat. No. 5,808,322, issued Sep. 15, 1998, illustrates a high intensity light integrated with a GaAs FET switch for use in microwave test equipment. U.S. Pat. No. 6,876,271, issued Apr. 5, 2005, illustrates a light source mounted within the same chamber as a FET for use as a damping circuit. Both of these patents are hereby incorporated by reference herein.

In the U.S. Pat. No. 5,808,322, the LEDs are mounted to a small pc board that gets mounted to the back side of a carrier pc board. The carrier pc board has holes strategically placed to allow LED light to shine through the holes to the top side of the carrier pc board where another pc board is mounted upside down so that the switches are placed right over the holes. Thus light shines on the GaAs FET attenuator switches through the carrier pc board holes, directly impacting the FETs, thereby imparting increased performance (by way of faster switching times) to the FETs.

In the U.S. Pat. No. 6,876,271, the LED is mounted on a circuit board and is placed above the FET so that the light from the LED will directly impact the FET, thereby imparting increased performance (by way of faster switching times) to the FET.

An older alternate arrangement, for example the arrangement shown in Agilent Part Number 5087-7137, has demonstrated that LEDs can be mounted on the same plane with the FET switch within a metal microcircuit enclosure having a metal lid. The light from the LED (which is directed upward and away from the FET) is reflected from the inside of the top of the metal enclosure and impacts the FET. Such an arrangement works well, but requires a metal housing to achieve the proper light transfer. In addition, such packages have used unpackaged LED die for mounting within the enclosure. Metal enclosures are large and expensive to manufacture and in many situations it is desirable to use smaller ceramic and/or plastic enclosures.

For example, one packaging arrangement called a Quad Flat No Lead (QFN) package, is essentially a conductive lead frame on which is mounted the electronic circuitry. Such packages are manufactured in high volumes and at relatively low cost and size as compared to traditional metal and/or ceramic housings. An opaque (usually black) encapsulating material is placed around the electronic elements to fill out the volume within the enclosure. This material, in addition to providing support and stability to the electronic devices, acts to inhibit light transfer from the light source to the other elements, thus preventing the use of low cost non-metallic housings for applications that depend upon good light transfer for proper operation.

SUMMARY

By adding light reflective and/or transparent and/or translucent material within a micro-electronic circuit housing, improved light transfer is achieved between a light generation source and a light utilization device. In one embodiment, the reflective material is placed on the inside surface of a non-metallic housing lid and the light from the light source (typically an LED) reflects from the reflective material and impacts the device (typically an FET). In another embodiment, the LED and FET are encased in a clear (low light-loss) material (typically silicone overcoat) so as to allow the light from the LED to reflect from the top surface of the clear material onto the FET. If desired, an opaque encapsulant surrounds the clear material and fills out the volume within the housing. In another embodiment, clear or translucent (as opposed to opaque) encapsulant can be used to serve dual purpose as both the structural (volume filling, defined package shape/outline) agent as well as to permit the internal light transmission and reflections to illuminate the device.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
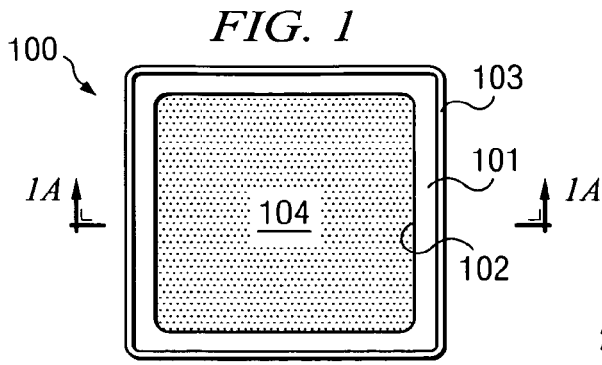
FIG. 1 shows one embodiment of a low cost hermetically sealable package lid.

FIG. 1 shows a bottom view of one embodiment 100 of a low cost hermetically sealable package lid. In this embodiment, package lid 100 is a ceramic housing, or cover, designed to be placed over a microcircuit, such as RF microcircuit 202, shown in FIG. 2.

Figure 1A:
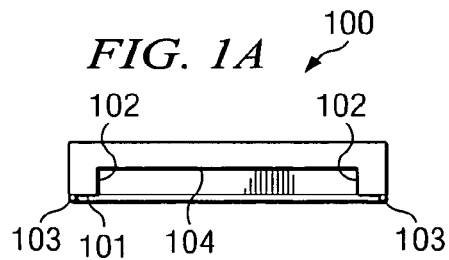
FIG. 1A shows a cross-section of the package lid of FIG. 1.

FIG. 1A shows a cross-section view of package lid 100 taken through section 1A of FIG. 1 showing inside surfaces 102 and 104 which will be sealed. The height of sides 102 and 104 can be made to fit over circuits 202 and 206-3 (FIG. 2) and can be made any height as required. A metallic bonding material, such as, for example, solder bead 103, is shown on edge 101 and this bead could be on the outside edge as shown, or on the inside edge, or could be flat along the full edge. Alternatively, the lid could be attached with epoxy if full hermeticity protection is not needed for reliable circuit operation and part lifetime.

The inside surface, including surfaces 104 and 102 of package lid 100, in one embodiment, is coated with a ceramic dielectric material which is then fired at a temperature of 1250° C. for one minute. Currently, the dielectric material being used is applied by Max Levy Autograph, Inc., 220 West Roberts Avenue, Philadelphia, Pa.; and is a material proprietary to Max Levy Autograph, Inc. Any glaze of any color could be used and if increased reflectivity is desired the glaze could be clear or otherwise made reflective.

A gold binding material, such as a ceramic gold mixture, is put on (by screening, sputtering, or otherwise) the bottom edges 101 and the package is again fired, this time to a temperature of 850° C. for one minute. The gold/tin solder 103 is put over the gold binding and the package lid is again fired, this time at 320° C. Note that gold/tin solder can be any material provided it will bond with the gold plated (or other) material of electronic circuit substrate 201 (FIG. 2) in a manner to avoid water vapor from penetrating the seal. Since in our example electronic circuit 202 is assumed to be mounted on a gold plated platform, such as platform 201 (FIG. 2), then solder bead 103 (shown best in FIG. 1A) could be gold/tin having a ratio of 80% gold to 20% tin. Alternatively, instead of applying the solder to the package lid, a separate solder preform could be used with a package lid to make the hermetic seal to the package substrate.

Figure 2:
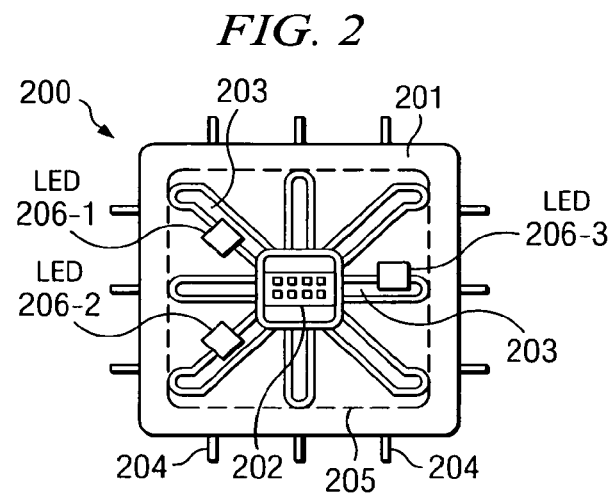
FIG. 2 shows one embodiment of an electronic circuit to be covered by the package lid of FIG. 1.

Edges 101 of package 100 are then brought into contact with substrate 201 between the broken line and the edge of substrate 201 as shown in FIG. 2. The metal (in this example, gold/tin) is bonded with the gold plating of the substrate at a temperature of 300° C.

One method of accomplishing such bonding is to bring the two pieces (100 and 200) into contact with one another in a carbon holding fixture and then applying electricity to the package. A weight can be used to force ceramic package lid 100 into better contact with substrate 201. The electricity heats the package and solder 103 from the ceramic package bonds with the gold plating of substrate 201. Note that the composition of the solder material on the lid controls the melting point of the seal and can be adjusted as necessary. Soldering, or other bonding, such as laser welding, brazing, welding, etc., of package 100 to substrate 201 should be performed in a dry nitrogen (or other drying) atmosphere. The assembled package should be tested for both gross and fine leakage. Note that it is also possible to obtain a hermetic seal by a low temperature glass being placed between a ceramic lid and a ceramic package.

Using this system, the clear seal inside the ceramic package allows internal LED light (for example, from LED 206-3, FIG. 2) to be reflected onto GaAs device 202 (FIG. 2), if desired, thereby increasing operating system performance.

The reason for glazing the inside surface of package lid 100 is to prevent moisture from wicking through the ceramic. Until recently it has been thought that the ceramic package lid itself was water tight. In actuality, a typical ceramic package lid is sufficiently grainy so as to allow water molecules to pass through. This realization has led to the glazing of inner surfaces of package lid 100. If desired, the outer surface could be glazed instead, or both inner and outer surface could be glazed and, if desired, reflective material added to further increase the reflectivity inside the package.

Figure 1B:
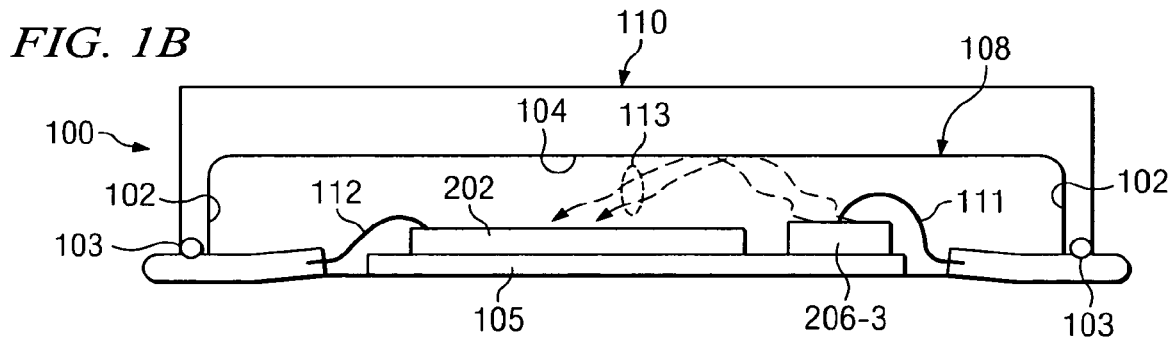
FIG. 1B shows a cross-section of a ceramic package substrate with a lid on top fitted against the substrate to form a package.

FIG. 1B shows a cross-section illustration of the ceramic package substrate. The lid 100 is on top and fitted against substrate 105 to form a sealed package 110. LED 206-3 is mounted on substrate 105 and emits light 113 from its top surface which light reflects from top surface 104 of lid 100. The reflected light impacts electronic device 202 which also is mounted to substrate 105. The inside of top surface 104 can be non-metallic but naturally reflective or could be coated to increase reflectivity. The top can be curved to direct the reflected light, if desired. In this example, as well as in the other examples discussed herein, electronic device 202 is a GaAs FET switch, but could be any type of device, including but not limited to devices constructed from GaAs, GaN or InP. While an FET device is shown, more complicated integrated circuits can be used. In some operations, the LED will remain on all the time, while in other operations the LED will only come on (perhaps for about 100 microseconds) when it is required for enhancing the operation of the electronic circuit. As will be discussed below, a clear encapsulant can be used instead of dry nitrogen so that light from LED 206-3 reflects off the top surface interface of the clear encapsulant onto the GaAs FET switch.

Figure 1C:
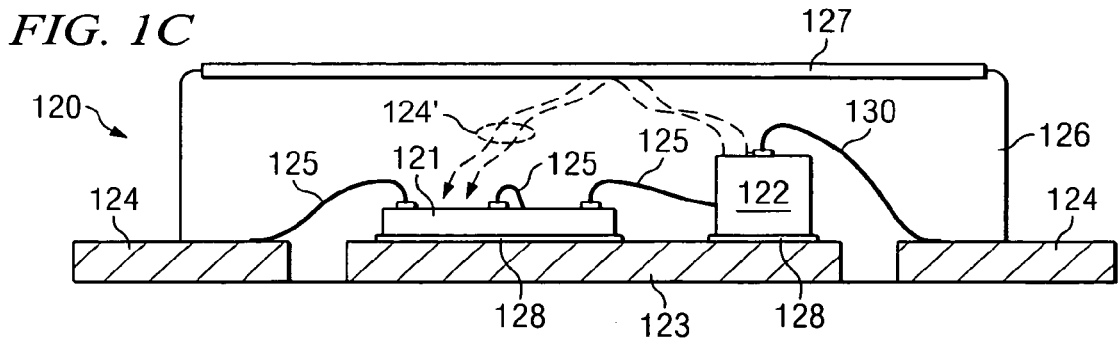
FIG. 1C shows the inventive concepts contained within a generic plastic molded surface mount package.

In the example of FIG. 1B, LED 206-3 (or as shown in FIG. 1C, LED 122) emits light in the red frequency range, but the light can be in any frequency range, across frequencies and can be either visible or invisible to the naked eye. In most situations, the light will be trapped within the device due to reflection off the inside top surface or the top surface interface of any clear encapsulant, but for some purposes it may be desirable to allow at least a portion of the light to escape. An example of letting some light escape would be to provide a visual indication that the light is on and functioning correctly.

Lid 100 can be a ceramic or plastic surface that can be coated on either the inside or the outside (or both) by a reflective (or partially reflective) material. This reflection can be added on the outside, for example, by silk screening, or by adhering a reflective (perhaps silvered) material to the surface. A low loss (at least low loss to the light frequency of interest) encapsulant could be positioned between LED 206-3 (and any other LED that is used) and top surface 104. The encapsulant serves to hold the electronic devices in place. Note that, if desired, lenses (not shown) can be added to more accurately pinpoint the light if desired. Note that the top surface can be shaped (not show) to focus reflected light onto GaAs FET switch circuitry. The light from the LED can either be focused by transmission through the lens or other material or by reflection off the lens or by both methods.

The cathode of the LED in the example of FIG. 1B is connected to ground via contact with substrate 105 while the anode is connected to an externally available terminal via bond wire 111. Similarly, device 202 is connected to the substrate and to one or more bond wires 112. Alternately, one terminal of a surface mount LED can be connected to the substrate ground 201, and the other terminal of the LED can be connected to a substrate trace 203, as shown in FIG. 2. this eliminates the need for bond wire 111.

FIG. 1C illustrates an embodiment of the invention as applied to any generic plastic molded surface mount package 120. FIG. 1C shows a cross-sectional view of the package with the GaAs (GaN, InP, etc.) device 121 and bare die LED 122 mounted to die paddle 123 with joining material 128 that would typically be conductive epoxy or a solder alloy. Device 121 and LED 122 are additionally connected to package I/O leads 124 with wire bonds 125 and 130. It should be noted that the package I/O leads could very well be trimmed flush as in the case of many lead-less packages. Typical low cost molded parts would use an opaque (usually black) encapsulant 126. The molded encapsulant provides protection and mechanically holds together the devices, die paddle, I/O leads, etc. as a fixed assembly and defines the final physical shape of the package.

The embodiment of FIG. 1C uses a clear or translucent (rather than opaque) encapsulant 126 to allow for light transmission 124' inside the package. Light from light source (LED) 122 is reflected at the top of the package due to the difference in the index of refraction at the bondary between clear encapsulant 126 and reflective surface coating 127 and impacts the device 121. It should be noted that there are many options for the reflective surface coating 127 such as: metalized or glazed coating, silkscreen or dye coating, patterned or matte surface finish, or in some cases outside air. The exact type of reflective surface coating chosen is based on cost and performance considerations.

The light transfer zone can be a solid lens type material, where the light is focused onto the electronic switching device, or the clear overcoat could be constructed to act not only as a light transmission medium but also as a lens to help focus and increase the light that impacts the switching device. If desired, the clear overcoat can be used for the entire encapsulant, thus allowing the light to reach the top, and/or side, surface and possibly even reflect back.

Additional types of packages in addition to commercially available ceramic packages can be used. These packages include Surface Mount (SMT) packages with adequate internal height, standard available SMT packages with increased height to reflect the LED light, plastic packages with lids that are heat welded on, leadless packages with the appropriate lid, and laminate packages. The clear/translucent overcoat or encapsulation implementation makes this approach applicable for many small, lower cost, plastic and chip scale packages. The packaging eliminates the need for air cavity packages thereby further reducing package height constraints and making it suited to high volume, low cost applications. The use of the overcoat protects the die and wire bonds from moisture, particulate contamination, and physical damage. Note that most plastic packages are not truly hermetic. If the GaAs FET switches and other GaAs IC circuitry are not well passivated to keep them moisture proof, then the hermetic package will have the longest mean time to failure in instrument applications. Some instrument applications require the hermetic package and other applications can be satisfied by the plastic packaged parts.

This technology will work well with both laminate and plastic SMT packages without microwave shielded enclosures. Not having shielding (metal walls) allows microwaves to escape instead of reflecting. This allows the packaged part to not have resonances so they function better at high frequencies. Microwave signals leaking out are easily damped out on the pc board assembly structure with its assembly cover.

As will be discussed below, the concepts discussed herein will work well for speeding up switching used in attenuators and speeding up switching in sending a signal between two or more ports.

This packaging arrangement also lends itself to low cost assembly. The standard surface mount (SMT) LEDs, or bare die LEDs, are placed on the substrate with conductive epoxy or solder at the same time that the GaAs (or other device) die is attached to the same substrate. In the case of the QFN package or any other plastic package, bare die chip LEDs are placed and wire bonded to the package lead frame at the same time as the GaAs die. The SMT or bare die LEDs and GaAs devices can be placed in the package without compromising RF package performance. The LEDs can remain on, if desired, to provide a small amount of heat, which can prolong the life of the GaAs switch in a non-hermitic package, by helping to keep moisture out.

FIG. 2 shows one embodiment 200 of an electronic device, such as electronic device 202, to be covered by package lid 100. Solder preform 103, as discussed above, could be on the outside edge of package lid 100, as shown, or on the inside edge (not shown), or across the entire edge (not shown). The inner edge of package lid 100 mates with substrate 201 along dotted line 205 thereby covering (protecting) circuit 202 and its various elements 203 from mechanical damage as well as from moisture. Connected within the package are LEDs 206-1, 206-2, 206-3 used as discussed above. Note that while three such light sources are shown, any number can be used, based only on the light intensity desired to impact the FET or other electronic device. Substrate 201 could have terminals 204 for connection to other system components.

Electronic device 200, with package lid 100 soldered in place, then can be added to a printed circuit board or to another substrate, if desired, (such as substrate 301, FIG. 3) using a solder compound requiring less heat, for example 230° C., to control the soldering process. The solder used for such a bonding could be, for example tin/lead. The new RoHS (lead free) solders also will work well, requiring 260° C. to make the bond.

Figure 3:
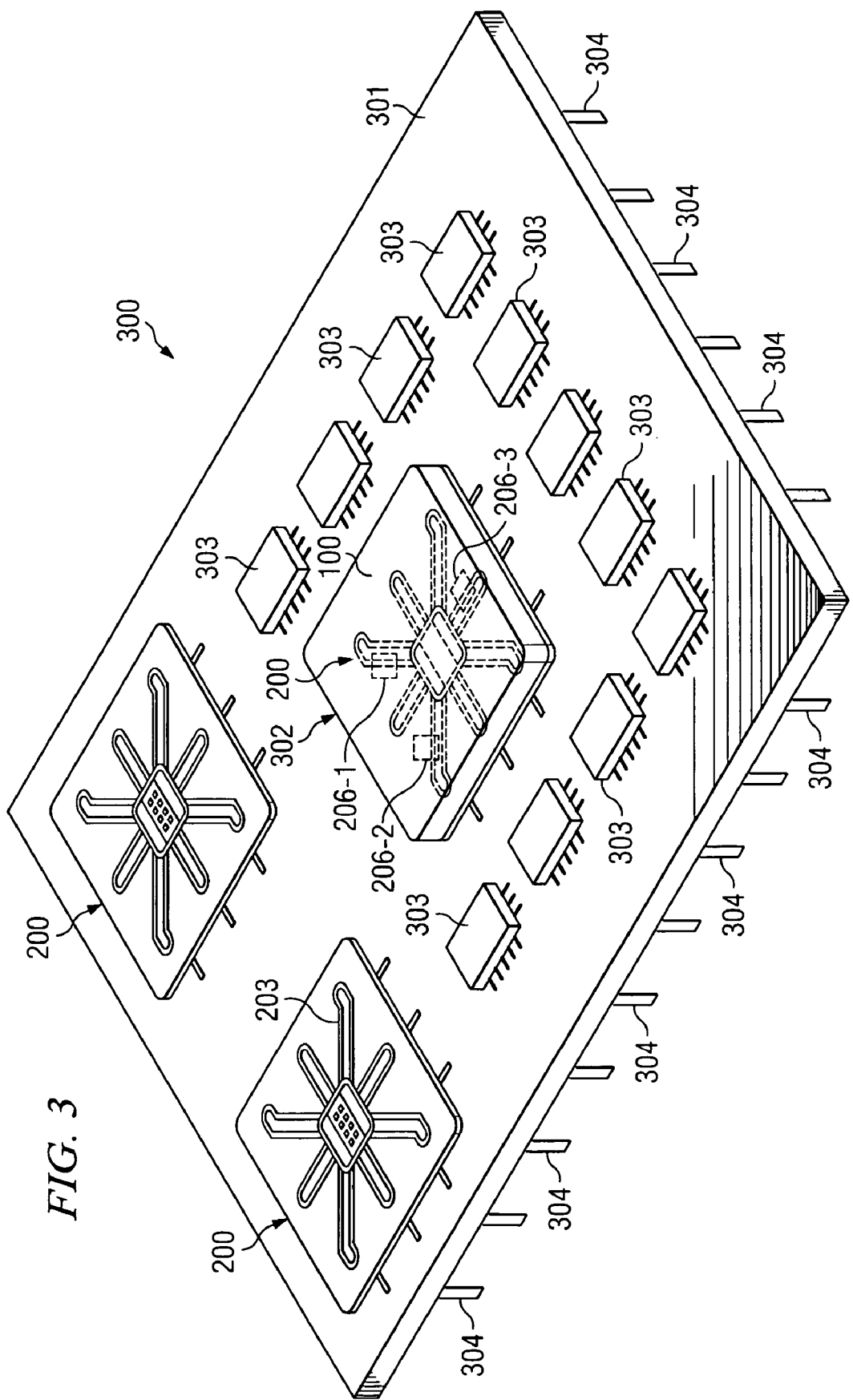
FIG. 3 shows one embodiment of a substrate having several electronic circuits and other components mounted thereon.

FIG. 3 shows one embodiment 300 of a printed circuit board or a substrate, such as substrate 301, having several electronic circuits, such as circuits 200, 302, and components, such as components 303 mounted thereon. Components 200 are shown uncovered, while component 302 is essentially component 200 with package lid 100 sealed thereto. Substrate 301 could have terminals 304, or flat planar terminals (not shown) for connection to other system components. The new RoHS (lead free) solders also will work well, requiring 260° C. to make the bond.

Figure 4A:
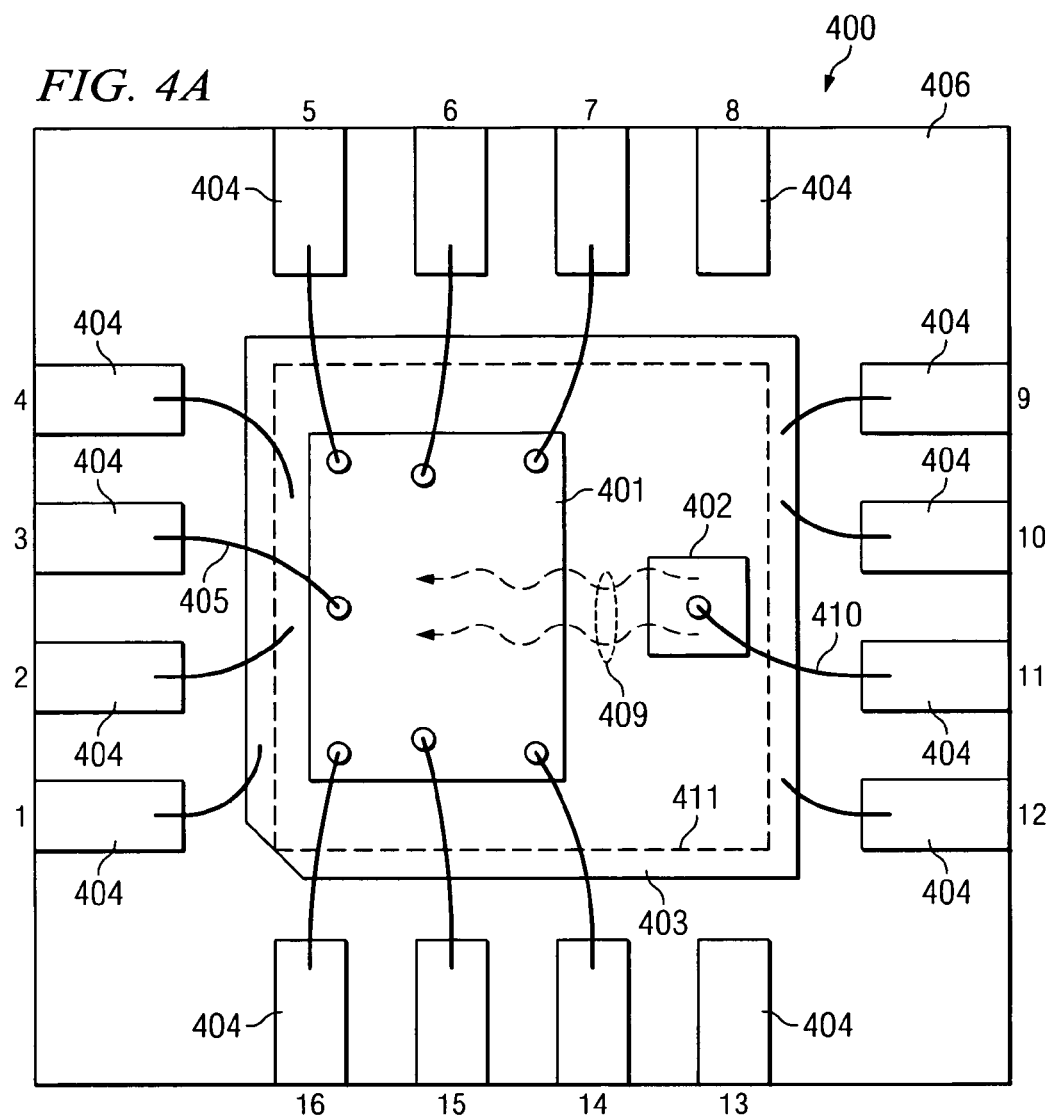
FIGS. 4A and 4B show side and top views, respectively, of an alternative embodiment contained within a molded plastic Quad Flat No Lead package.

FIG. 4A shows a top view of the layout of microcircuit 403 having electronic device 401 and LED 402 positioned therein in a plastic molded Quad Flat No lead (QFN) package with leads 404.

Figure 4B:
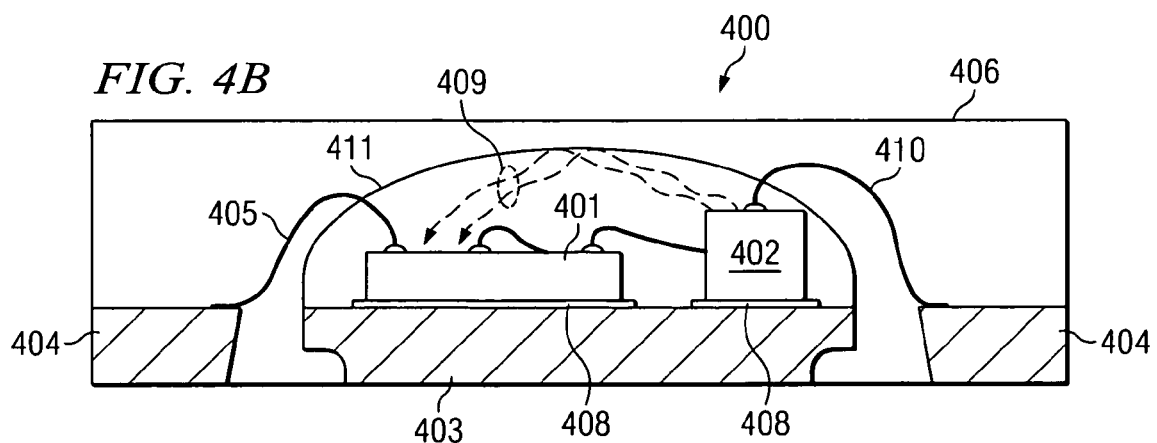

FIG. 4B is a cross-sectional view of the package of FIG. 4A. The opaque encapsulant (molding compound) 406 gives rigidity to and defines the outline of package 400. Note that the implementation is not limited to the QFN style package, but rather is applicable to any low cost, molded plastic package. In this embodiment clear seal 411 (typically a silicone die overcoat) is applied over device 401 and LED 402 prior to molding with an opaque (black in this instance) molding compound (encapsulant) 406. An alternative embodiment, as shown in FIG. 1C, would be to use a clear or translucent molding (encapsulant) compound, thus eliminating the need for the extra clear die overcoat. Ground is connected, for example via pins 1, 2, 4, 9, 10, and 12, to the surface of microcircuit 403 on which LED 402 and device 401 are mounted with joining material 408. Pin 11 via wirebond 410 controls the on/off condition of LED 402 and pins 6 and 15 supply ground to device 401. Pins 5 and 16 control the operation of the switch, while pins 3 (wirebond 405), 7 and 14 are the signal terminals. Note that LED 402 can be on all the time or can be controlled by an external signal. Alternatively, LED 402 can be connected to device 401 so that when that device begins to switch, the LED, or any number of LEDs, light up to enhance the switching speed. Light 409 from light source (LED) 402 is reflected due to the difference in the index of refraction and angle of incidence at the boundary between the clear overcoat 411 and the opaque encapsulant 406 and impacts the device 401.

Note that devices 401 and 402 are shown mounted to the same substrate (as are the devices within the packages shown in FIGS. 1B and 1C). This is illustrated in this manner for simplicity but in actual practice one or more of the devices may be mounted slightly higher, for example, on a dielectric shelf. This then would make the base of the one element, for example, the LED, higher by perhaps about 0.25 mm than the base of one or more of the other elements. As used in the application, a device sitting higher than another device but ultimately physically connected to the same substrate (or to a separate substrate on the same plane as the first substrate) is considered to be coplanarly mounted with that other device. Devices mounted to separate substrates where the substrates lie in the same plane and approximately at the same elevation within a housing are also said to be coplanar.

Figure 5:
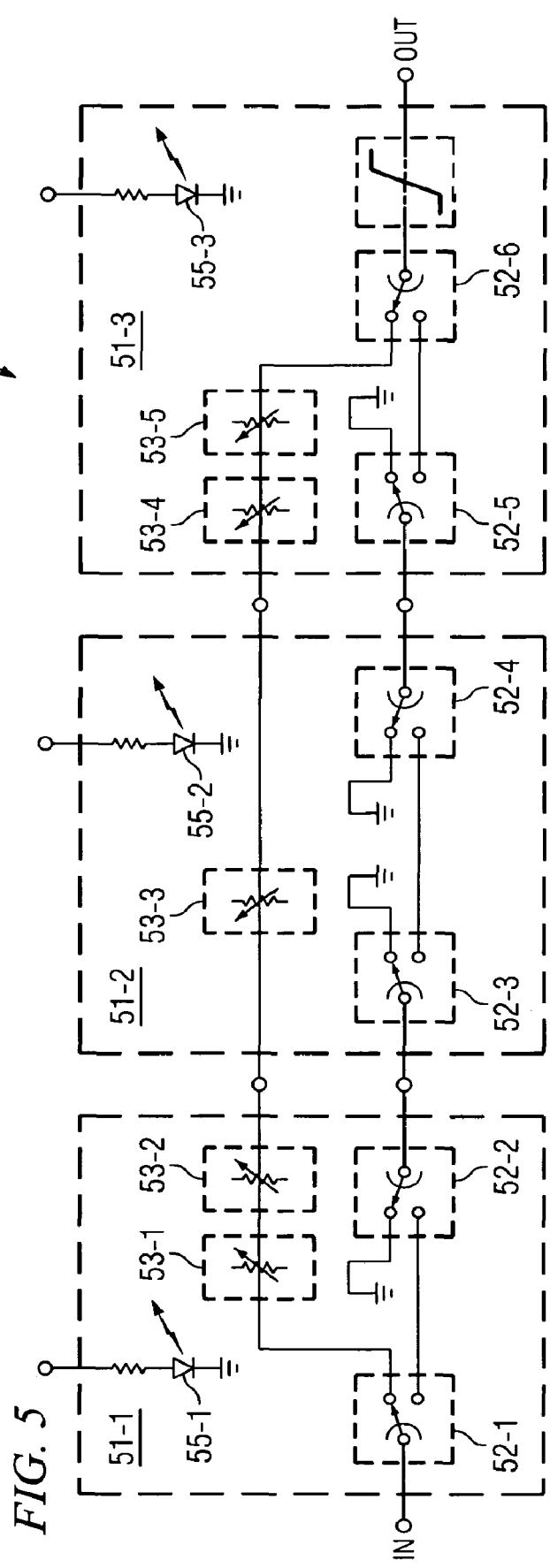
FIG. 5 shows one embodiment of a circuit using the concepts of this invention.

FIG. 5 shows one embodiment 50 of an attenuator that can be constructed using the concepts discussed above. Shown in FIG. 5 is three segmented circuit 50 having segments 51-1, 51-2 and 51-3. Each segment has one or more LEDs, such as LEDs 55-1, 55-2 and 55-3, to assist the switching speed of switches 52-1 to 52-6 within the segment. The light also assists the switching speed of the attenuator ICs 53-1 to 53-5 since they too contain integrated switches. Note that the number of such LEDS can be different for each segment if desired, or could be different depending upon the device characteristics desired from time to time.

Circuit 50 provides not only an extension of the electronic step attenuator's maximum frequency range to 6 GHz or above, but also circuit 50 adds no measurable distortion to the signal, while achieving the minimum possible insertion loss yielding the highest output signal level. Low insertion loss from the output step attenuator also means that for a given output power at the instrument's output connector, the output amplifiers will be operating at a lower RF power level, leading to lower distortion to the signal added by the output amps.

In order to eliminate the output step attenuator as a contributor to the distortion of the signal, and to maximize the output power of the source by minimizing the insertion loss of the attenuator in its 0 dB state, circuit 50 has a two path topology. One path has the same arrangement of step attenuator ICs 53-1 to 53-5 as in the previous Multi-Chip Modules (MCM), while the second "high power" path consists of six low loss, low distortion SPDT GaAs FET switches 52-1 to 52-6. This topology adds no measurable distortion to the output signals, while at the same time gives 4 dB lower loss in the 0 dB state at 6 GHz than using the previous step attenuator ICs, and does all of this using pre-existing ICs. The highest ~10 dB of signal power goes through the high power path of the attenuator, with the power setting capability coming from the Automatic Level Control (ALC) of the source (not shown). When lower power levels are desired from the signal source, the ALC can be set to deliver signals of lower than ~5 dB below the maximum power to the step attenuator, and the step attenuator can add any additional attenuation above that value. A circuit that operates in this manner has been available for several years packaged in a housing having at least one metal surface (a Lid).

In order to provide a low cost packaging solution that is extendable to greater than 40 GHz without changing the packaging format and without using a metal housing, a packaging approach using the concepts discussed herein is achieved by dividing the step attenuator into three SMT laminate based 10 mm×10 mm (MCMs). The frequency performance of the PCB transmission line to package transitions used in these MCMs has been shown to give excellent performance to beyond 50 GHz, allowing for straightforward extensions of these 6 GHz MCMs to higher frequencies. The use of standardized low cost SMT assembly techniques, as discussed above, both for assembling the ICs in the package and the package to the PCB, allowed the cost of this solution to be lower than that of the previous MCM based solution used in the ESG sources, even with the additional SPDT ICs employed in this topology.

The fast switching and settling time of the previous step attenuator was maintained by continuing the use of high intensity LEDs to illuminate the ICs to effectively eliminate the gate lag (slow tails) effect in the GaAs FET based switch ICs and step attenuator ICs. This effect works by the photons from the LED ejecting the electrons in traps at the GaAs surface near the FET gate, such that the traps are always nearly empty. Thus, there is no slow emptying of the traps when the FET is turned ON, and no change in channel conductance. With the use of the higher intensity, low cost SMT LEDs that have been developed in the last few years, and by selecting a dielectric lid (or other non-metallic reflective material) with a suitable optical reflectance, LEDs can be mounted on the package shelf (or slightly above the package shelf) with their light projected upward. The light reflected back down from a top surface is of suitable intensity and distribution to suppress the gate lag effects of the GaAs FETs in the ICs, while adding minimal cost to the solution. While one LED is shown in the drawing, three LEDs can be used in each module to make sure there are no dead spots in illumination over any of the ICs containing FETs.

The extremely low loss and low distortion GaAs FET SPDT switches used in this topology have a maximum insertion loss of 0.5 dB at 6 GHz. With all six of these SPDT switches in series, there is about 4 dB less insertion loss at 6 GHz than the insertion loss of the five step attenuator ICs in series in their 0 dB states at 6 GHz. The isolation of each switch in its OFF state of greater than 30 dB for frequencies to 6 GHz is sufficient to give the necessary isolation under the most stringent conditions of when the step attenuator is set to its 130 dB state. The larger size of the FETs on these switch ICs compared to the FETs used on the step attenuator ICs, particularly the 40 dB step attenuator IC, are what allow for the improved distortion performance of the two path approach used in this solution.

Although the present invention and its advantages have been described in detail, it should be understood that various changes, substitutions and alterations can be made herein without departing from the spirit and scope of the invention as defined by the appended claims. For example, as new epoxy glues and plastic molding compounds become available it is possible that they have increased moisture resistance. Some of these epoxies can then be used to attach the glazed package lid to the package substrate, achieving much better moisture resistance than previously possible. Such a package lid may not be able to achieve hermetically, as defined above, but may be entirely appropriate for electronic circuit protection in some instances. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A non-metallic package comprising therein:
   an LED;
   an electronic device; and
   a clear seal to allow light from said LED to be reflected onto said electronic device;
   wherein said electronic device comprises a switch having a first switching time in the absence of said reflected light and a second switching time in the presence of said reflected light, said second switching time being shorter than said first switching time.

2. The package of claim 1 wherein said electronic device is selected from the list of GaAs device, InP, and GaN devices.

3. The package of claim 2 wherein said package is selected from the list of ceramic and plastic.

4. The package of claim 3 wherein said plastic is a QFN package.

5. The package of claim 3 comprising:
   a non-metallic lid: and
   a bonding agent on the edges of said package lid where said edges contact said package so as to create a hermetic seal for said electronic package, said bonding agent selected from the list of metallic, glass, and epoxy.

6. The package of claim 5 wherein said lid contains reflective material.

7. The package of claim 3 further comprising:
   a lid shaped to focus light onto specific electronic devices.

8. The package of claim 5 wherein said clear seal is applied to an inside surface of said lid to enhance reflectivity as well as hermeticity.

9. The package of claim 1 wherein said clear seal surrounds said LED and said electronic device.

10. The package of claim 9 wherein said seal is a clear silicone polymer.

11. The package of claim 9 wherein said clear seal has a low loss to light in a particular frequency range.

12. A non-metallic package comprising therein:
    an LED;
    an electronic device; and
    a clear seal to allow light from said LED to be reflected onto said electronic device;
    wherein said clear seal comprises:
       a lens positioned so as to focus light from said LED onto said electronic device.

13. A non-metallic package comprising therein:
    an LED;
    an electronic device; and
    a clear seal to allow light from said LED to be reflected onto said electronic device;
    wherein said clear seal comprises:
       a molding material that serves both as a structural body of the package and a light transmission/reflection medium.

14. An electronic micro-circuit having internal light enhancement, said micro-circuit enclosed within a non-metallic package, said package comprising:
    a substrate upon which a plurality of components can be mounted;
    a source of light mounted on said substrate;
    an electronic switching device mounted coplanarly with said source of light, the switching operation of said electronic component being enhanced by light from said light source; and
    a seal reflecting light emitted from said light source such that at least a portion of said light impacts said electronic device.

15. The circuit of claim 14 wherein said electronic device is selected from the list of GaAs, InP, and GaN devices.

16. The circuit of claim 14 wherein said electronic device is a FET or an IC.

17. The circuit of claim 14 wherein said light source is an LED chip.

18. The circuit of claim 14 wherein said seal comprises;
    a reflective seal placed on at least one surface of said package.

19. The circuit of claim 14 wherein said seal comprises:
    a clear silicone overcoat surrounding said light source and said electronic circuit.

20. The circuit of claim 14 wherein said seal comprises:
    a rigid clear encapsulant surrounding said electronic device and said light source.

21. The circuit of claim 14 wherein said seal comprises:
    a non-metallic lid that is naturally light reflective; or
    a reflective seal placed on the inside surface of said lid.

22. The circuit of claim 14 wherein said seal comprises:
    a lens positioned so as to focus light from said light source onto said electronic device.

23. An attenuator comprising:
    a plurality of attenuation stages serially interconnected; each said stage having at least one switching device requiring enhancement by light impacting said switching device;
    each said stage being contained in a separate non-metallic housing, each said housing containing at least one said switching device and at least one light source, said switching device and said light source mounted coplanar to each other; and
    a light reflector within each said package for directing light from said light source to impact said switching device; wherein said switching device has a first switching time in the absence of said directed light and a second switching time in the presence of said directed light, and
    wherein said enhancement comprises said second switching time being shorter than said first switching time.

24. The attenuator of claim 23 wherein said switching device and said light source are mounted on a common substrate.

25. The attenuator of claim 24 wherein said light reflector comprises a coating positioned on a non-metallic lid of said package.

26. The attenuator of claim 24 wherein said reflector comprises a low light loss material encompassing said switching device and said light source.

27. The attenuator of claim 24 wherein said switching device comprises a GaAs FET and said light source comprises an LED chip, said LED positioned so that light emits there from in a direction away from said switching device.

* * * * *

UNITED STATES PATENT AND TRADEMARK OFFICE
CERTIFICATE OF CORRECTION

| | | |
|---|---|---|
| PATENT NO. | : 7,847,301 B2 | Page 1 of 1 |
| APPLICATION NO. | : 11/291949 | |
| DATED | : December 7, 2010 | |
| INVENTOR(S) | : Fred H. Ives et al. | |

It is certified that error appears in the above-identified patent and that said Letters Patent is hereby corrected as shown below:

In column 9, line 22, in Claim 5, delete "lid:" and insert -- lid; --, therefor.

In column 10, lines 30-46, delete "23. An attenuator comprising:
a plurality of attenuation stages serially interconnected; each said stage having at least one switching device requiring enhancement by light impacting said switching device;
  each said stage being contained in a separate non-metallic housing, each said housing containing at least one said switching device and at least one light source, said switching device and said light source mounted coplanar to each other; and
  a light reflector within each said package for directing light from said light source to impact said switching device;
  wherein said switching device has a first switching time in the absence of said directed light and a second switching time in the presence of said directed light, and
  wherein said enhancement comprises said second switching time being shorter than said first switching time."
and insert -- An attenuator comprising:
a plurality of attenuation stages serially interconnected; each said stage having at least one switching device requiring enhancement by light impacting said switching device;
  each said stage being contained in a separate non-metallic housing, each said housing containing at least one said switching device and at least one light source, said switching device and said light source mounted coplanar to each other; and
  a light reflector within each said package for directing light from said light source to impact said switching device;
  wherein said switching device has a first switching time in the absence of said directed light and a second switching time in the presence of said directed light, and wherein said enhancement comprises said second switching time being shorter than said first switching time. --, therefor.

Signed and Sealed this
Twelfth Day of April, 2011

David J. Kappos
*Director of the United States Patent and Trademark Office*